(12) United States Patent
King

(10) Patent No.: US 8,699,724 B2
(45) Date of Patent: Apr. 15, 2014

(54) VOLUME SCALE SELECTION

(75) Inventor: Jimmy King, Marina Del Rey, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 379 days.

(21) Appl. No.: 13/065,719

(22) Filed: Mar. 28, 2011

(65) Prior Publication Data

US 2012/0250887 A1    Oct. 4, 2012

(51) Int. Cl.
*H04R 5/033*    (2006.01)
*H03G 1/02*    (2006.01)

(52) U.S. Cl.
USPC .............. 381/104; 381/74; 381/105; 381/107

(58) Field of Classification Search
USPC .............................. 381/104–105, 107–109, 74
See application file for complete search history.

(56) References Cited

U.S. PATENT DOCUMENTS

| 7,624,259 | B2 | 11/2009 | Bear et al. | |
|---|---|---|---|---|
| 2004/0151336 | A1 | 8/2004 | Han et al. | |
| 2008/0205681 | A1* | 8/2008 | Norberg et al. | 381/334 |
| 2009/0316931 | A1* | 12/2009 | Dai et al. | 381/104 |
| 2010/0027807 | A1 | 2/2010 | Jeon | |
| 2010/0040240 | A1 | 2/2010 | Bonanno | |
| 2010/0104119 | A1 | 4/2010 | Lan | |

* cited by examiner

*Primary Examiner* — Duc Nguyen
*Assistant Examiner* — George Monikang
(74) *Attorney, Agent, or Firm* — Neal Patel

(57) ABSTRACT

Embodiments herein relate to volume scale selection by a computing device. In an embodiment, the computing device includes a rotational device to assert a volume signal when the rotational device is rotated. Further, the computing device is to select one of a plurality of volume scales based on whether a peripheral audio device is connected to the computing device and is to correlate the volume signal to one of a plurality of values of the selected volume scale.

12 Claims, 3 Drawing Sheets

200

| Frequency | Volume Scale | | Acceleration Value |
|---|---|---|---|
| | Main Scale | Peripheral Scale | |
| 2< | 0 | 0 | 0 |
| 2~3 | 1 | 1 | 0 |
| 4~5 | 2 | 2 | 0 |
| 6~7 | 4 | 3 | 1 |
| 8~9 | 6 | 4 | 2 |
| 10~11 | 8 | 5 | 3 |
| 12~13 | 10 | 6 | 4 |
| ≥14 | 12 | 7 | 5 |

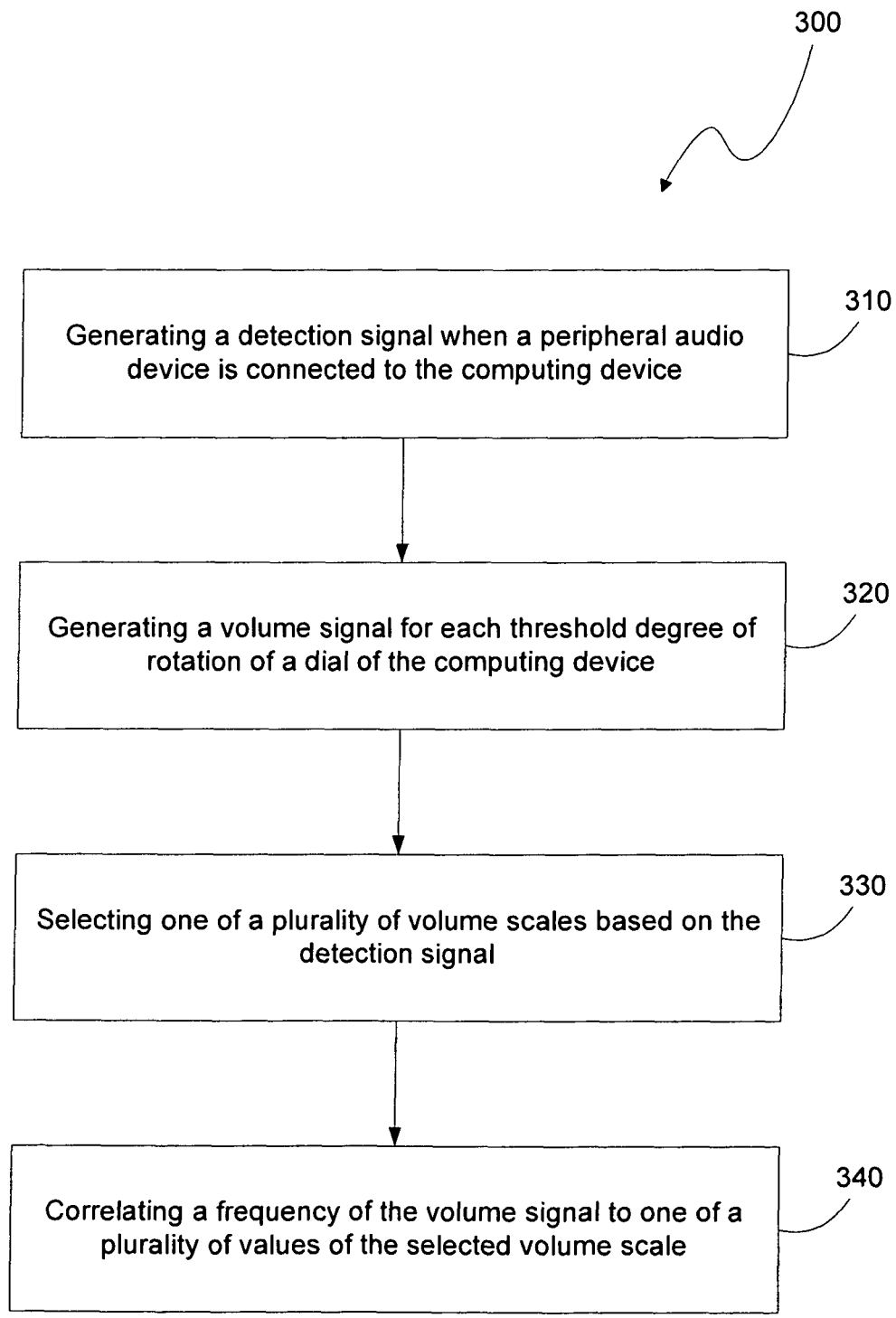

VOLUME SCALE SELECTION

BACKGROUND

Some computing devices, such as laptops, are equipped with physical rotational devices, such as jog dials, to control a volume output. These computing devices usually include a main audio device, such as internal speakers, so that when a user rotates the rotational device, the volume of the internal speakers can be increased or decreased. However, the rotational device can also be used to control the volume output of a peripheral audio device, such as headphones, connected to the computing device.

BRIEF DESCRIPTION OF THE DRAWINGS

The following detailed description references the drawings, wherein:

FIG. 3 is a flowchart of an example method for varying a volume scale of a computing device.

DETAILED DESCRIPTION

Specific details are given in the following description to provide a thorough understanding of embodiments. However, it will be understood by one of ordinary skill in the art that embodiments may be practiced without these specific details. For example, systems may be shown in block diagrams in order not to obscure embodiments in unnecessary detail. In other instances, well-known processes, structures and techniques may be shown without unnecessary detail in order to avoid obscuring embodiments.

Embodiments provide a generally safer and more accurate method and/or device to vary a volume output to a peripheral device, such as headphones, connected to a computing device, such as a laptop, where the computing device includes a rotational device to control the volume output. A level of a volume output, while adequate for a main audio device of a computing device, may be too high for the peripheral audio device. Moreover, if a user rotates a rotational device too quickly, the user may cause volume output to increase too rapidly and/or to a level too high for the user or peripheral audio device. As a result, the user may experience discomfort, pain, or damage to the user's ear. In addition, the peripheral audio device may also be damaged.

Embodiments may include the computing device to detect when the peripheral device is connected to the computing device. The computing device may then use a different volume scale when the peripheral device is connected to the computing device. In one embodiment, the different volume scale may require a larger degree of rotation by the rotational device in order to vary the volume output compared to when the peripheral device is not connected to the computing device.

Accordingly, the volume may increase at a slower rate upon rotating the rotational device, when the peripheral audio device is connected to the computing device. Further, a maximum of the volume may also be lower when the peripheral audio device is connected to the computing device. Therefore, the likelihood of a user rotating the rotational device at too quick of a rate and accidentally increasing the volume to too high a value may be reduced or avoided. As a result of the volume being too high, pain or discomfort to the user and/or damage to the peripheral audio device may also be reduced or avoided.

Figure 1:
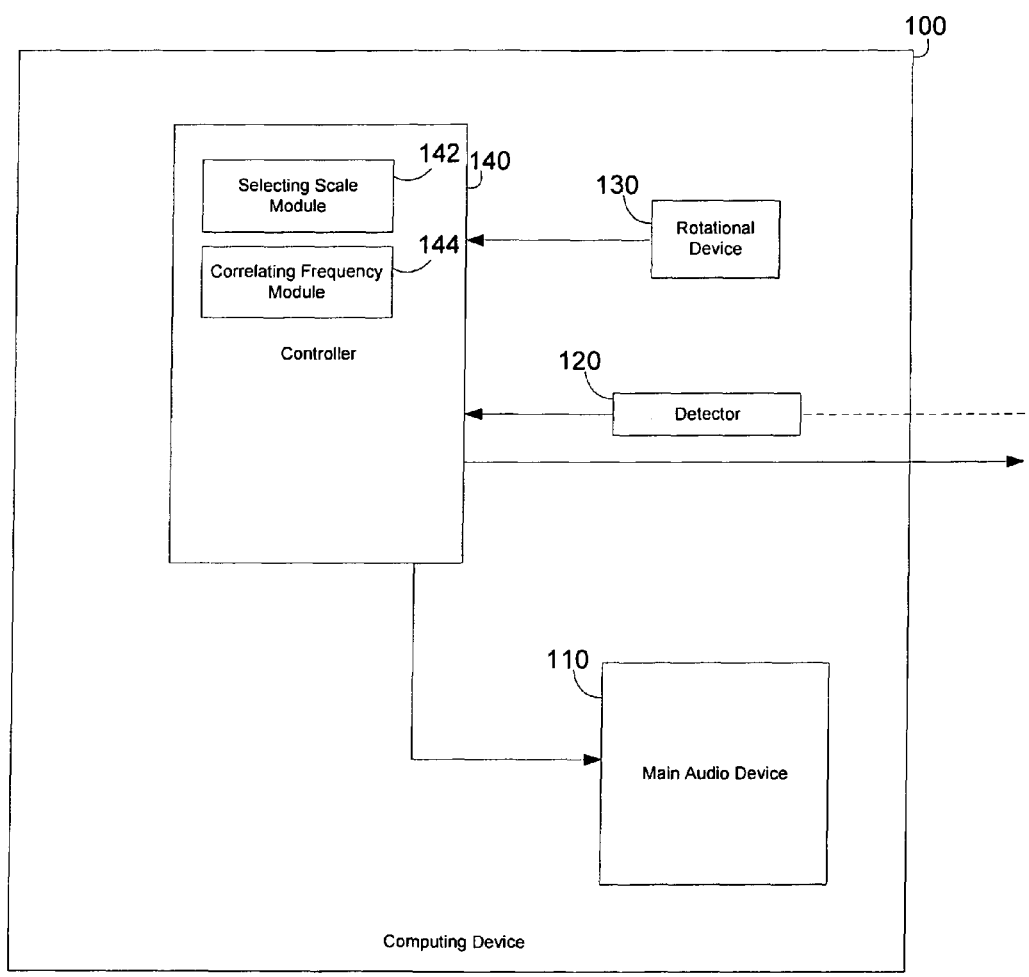
FIG. 1 is a block diagram of an example computing device.

FIG. 1 is a block diagram of an example computing device 100. Embodiments of the computing device 100 may include, for example, a notebook computer, a desktop computer, an all-in-one system, a slate computing device, a portable device, a wireless email device, a mobile phone, and the like.

In the embodiment, the computing device 100 may be connected to a peripheral audio device (not shown). Embodiments of the peripheral audio device may include headphones, a speaker, an audio output device, and the like. The computing device 100 includes a main audio device 110, a detector 120, a rotational device 130 and a controller 140.

The main audio device 110 is to output audio. Examples of the main audio device 110 may include stand-alone or integrated speakers, and the like. The controller 140 is to output a control signal to the main audio device 110 to control an output volume of the main audio device 110.

The detector 120 may be any type of device or mechanism to assert a detection signal when the peripheral audio device is connected to the computing device 100, such as a voltage divider. The detector 120 may include a conductor, such as a pin of an audio jack, to detect when a connector, such as a plug of the peripheral audio device 160, is connected to the computing device 100. For example, in one embodiment, the voltage divider included in the detector 120 may detect a change in the voltage level when the connector makes contact with the conductor. Upon detecting the connection to the peripheral audio device 160, the detector 120 is to output the detection signal to the controller 140.

The rotational device 130 is to assert the volume signal when the rotational device 130 is rotated. In FIG. 1, the rotational device 130 is to assert the volume signal for every partial rotation of the rotational device 130. For example, the rotational device 130 may assert the volume signal for every 4.5, 7.5, or 12.5 degree rotation of the rotational device 130.

The rotational device 130 may be a rotatable plate, disk, wheel, dial and the like. For example, a user may rotate the rotational device 130 in a first direction or a second direction opposite the first direction. The rotation may result in an increase or decrease in the volume output of the peripheral audio device 160 or the main audio device 110 via the controller 140.

The controller 140 is to select one of a plurality of volume scales based on the detection signal and to correlate a frequency of the volume signal to one of a plurality of values of the selected volume scale. The controller 140 may include one or more central processing units (CPUs), semiconductor-based microprocessors, and/or other hardware devices suitable for access and execution of instructions stored in a machine-readable storage medium.

In FIG. 1, the controller 140 also includes a selecting scale module 142 and a correlating frequency module 144, which may be stored in one or more machine-readable storage mediums (not shown). The modules 142 and 144 may part of one or one or applications and the machine-readable storage medium may be any electronic, magnetic, optical, or other physical storage device that contains or stores the modules 142 and 144.

While FIG. 1 shows the selecting scale module 142 and the correlating frequency module 144 to be internal to the controller 140, embodiments may also have the selecting scale module 122 and the correlating frequency module 144 being external to the controller 140.

The selecting scale module 142 may select one of a plurality of volume scales based on the detection signal and the correlating frequency module 144 may correlate a frequency of the volume signal to one of a plurality of values of the selected volume scale. The modules 142 and 144 will be explained in greater detail with respect to the controller 140 below.

The controller 140 is to determine the frequency or count of the volume signal based on a number of times the volume signal is asserted during a measurement time period. The measurement time period may, for example, be determined experimentally or set according to a manufacturer's or user's specifications. In one embodiment, the measurement time period may be 200 milliseconds (ms). For example, if the volume signal is asserted six times during the 200 ms time period, the controller may determine the frequency or a count to be six and use the number six as a lookup value into at least one of the plurality of volume scales. Therefore, the frequency or count may be correlated to a volume value in at least one of the plurality of volume scales. The plurality of volume scales may include at least a main scale and a peripheral scale.

The controller 140 is to output the correlated volume value to the peripheral audio device using the peripheral scale when the detection signal is asserted and is to output the correlated value to the main audio device using the main scale when the detection signal is not asserted.

In an embodiment, the frequency or count may correspond to one of the values in each of the main and peripheral scales. The value of the main scale may be greater than that of the peripheral scale for at least one of the corresponding frequency numbers.

The values of the main scale may increase at a greater rate than that of the peripheral scale for at least part of a corresponding range of the frequency numbers or counts. A maximum of the values of the main scale may be greater than a maximum of the values of the peripheral scale.

Figure 2:
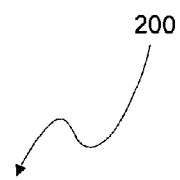
FIG. 2 is a table of an example volume scale.

FIG. 2 is a table of an example volume scale 200 including the main scale and the peripheral scale. As shown in FIG. 2, each of the values of the main scale correspond to a sum of the value of peripheral scale for the corresponding frequency and an acceleration value, the acceleration value correspondingly increasing for at least one of the frequencies. However, embodiments may include various other types of relationships between the main and peripheral scales, or there may be no relationship at all between the main and peripheral scales. The values of the main and peripheral scales correspond to a volume output, which may be measured in decibels (db). For example, in an embodiment, each unit of the value may correspond to 10 db, so that value 12 may correspond to 120 db. However, the values of the main and peripheral scales may also correspond various other units of measure in embodiments.

As shown in FIG. 2, the acceleration values are initially zero for frequencies five and lower. The acceleration value then increases to one for frequencies of six and seven, two for frequencies of eight and nine, three for frequencies of ten and eleven, four for frequencies of twelve and thirteen, and five for frequencies of fourteen or greater. While the term frequency is shown in FIG. 2, the term count and other similar terms may also be used in embodiments.

Therefore, the main scale has higher values than the peripheral scale for frequencies of six and higher. Moreover, the values of the main scale increase at a greater rate than that of the peripheral scale for frequencies of six and higher. Thus, if the user rotates the rotational device too quickly, such as for frequencies of six and greater, the volume will increase at a lower rate when the user is using the peripheral audio device, such as headphones. As a result, the pain or irritation to the user or damage to the user's ear caused by a dramatic increase in the volume to the peripheral audio device may be avoided or reduced. Further, a likelihood of damage to the peripheral audio device may also be reduced or avoided.

FIG. 3 is a flowchart of an example method 300 for varying a volume scale of a computing device. Although execution of the method 300 is described below with reference to the computing device 100, other suitable devices for execution of the method 300 will be apparent to those of skill in the art. In the embodiment of FIG. 3, at block 310, the detector 120 generates a detection signal when the peripheral audio device is connected to the computing device 100. Next, at block 320, the rotational device 130 generates a volume signal for each threshold degree of rotation of a rotational device of the computing device 100. As explained above, in embodiments, the threshold degree of rotation may be determined experimentally or set according to a manufacturer's or user's specifications.

Then, at block 330, the controller 140 selects one of a plurality of volume scales based on the detection signal. The plurality of volume scales may include a main scale and a peripheral scale, as explained above. During the selecting at block 330, the controller 140 selects the peripheral scale when the detection signal is generated and selects the main scale when the detection signal is not generated.

Lastly, at block 340, the controller 140 correlates a frequency of the volume signal to one of a plurality of values of the selected volume scale. The frequency may be a value corresponding to a number of times the volume signal is generated during the measurement time period, as explained above.

According to the foregoing, embodiments provide a generally safer and more accurate method and/or device to vary a volume output to a peripheral audio device, such as headphones, connected to a computing device, such as a laptop, where the computing device includes a rotational device to control the volume output. For example, embodiments may include the computing device to use a different volume scale when the peripheral audio device is connected to the computing device, so that the volume does not increase as rapidly and/or has a lower maximum value when rotating the rotational device, in order to prevent or reduce damage to the user and/or the peripheral audio device.

I claim:
1. A computing device, comprising:
a main audio device to output audio;
a detector to assert a detection signal if a peripheral audio device is connected to the computing device;
a rotational device to assert a volume signal for every partial rotation of the rotational device, and
a controller to select one a of a plurality of volume scales based on the detection signal and to correlate the volume signal to one of a plurality of values of the selected volume scale,
wherein the controller is to determine a frequency of the volume signal based on a number of times the volume signal is asserted during a measurement time period, and the frequency corresponds to a value in each of a main volume scale and a peripheral volume scale.
2. The device of claim 1, wherein,
the controller is to output the correlated value to the peripheral audio device using the peripheral scale when the detection signal is asserted and is to output the correlated value to the main audio device using the main scale when the detection signal is not asserted.
3. The device of claim 2, wherein the value of the main scale is greater than that of the peripheral scale for at least one of the corresponding frequency numbers.

4. The device of claim 2, wherein the values of the main scale increase at a greater rate than that of the peripheral scale for at least part of a corresponding range of the frequency numbers.

5. The device of claim 2, wherein a maximum of the values of the main scale is greater than a maximum of the values of the peripheral scale.

6. The device of claim 2, wherein each of the values of the main scale corresponds to a sum of the value of peripheral scale for the corresponding frequency and an acceleration value, the acceleration value correspondingly increasing for at least one of the frequencies.

7. A system, comprising:
   the computing device of claim 1;
   a peripheral device, where the peripheral device is a headphone; and
   the main audio device is an internal speaker of the computing device.

8. A computing device, comprising:
   a detector to assert a detection signal when a peripheral audio device is connected to the computing device;
   a rotational device to assert a volume signal for every partial rotation of the rotational device; and
   a controller to count a number of times the volume signal is asserted during a measurement time period to determine a frequency of the volume signal, and to select between a main volume scale and a peripheral scale based on the detection signal, the count corresponding to one of a plurality of values in each of the main and peripheral volume scales,
   wherein each of the values of the main scale corresponds to a sum of the value of peripheral scale for the corresponding frequency and an acceleration value, the acceleration value corresponding increasing for at least one of the frequencies.

9. The device of claim 8, wherein the values of the main scale increase at a greater rate than that of the peripheral scale for at least part of a corresponding range of the counts.

10. A method for varying a volume scale of a computing device, comprising:
    generating a detection signal when a peripheral audio device is connected to the computing device;
    generating a volume signal for each threshold degree of rotation of a rotational device of the computing device;
    selecting one of a plurality of volume scales based on the detection signal; and
    correlating a frequency of the volume signal to one of a plurality of values of the selected volume scale,
    wherein the frequency of the volume signal is determined based on a number of times the volume signal is generated during a measurement time period, and the frequency corresponds to a value in each of a main volume scale and a peripheral volume scale.

11. The method of claim 10, wherein,
    the selecting selects the peripheral scale when the detection signal is generated and selects the main scale when the detection signal is not generated.

12. The method of claim 11, wherein the values of the main scale increase at a greater rate than that of the peripheral scale for at least part of a corresponding range of the frequencies.

* * * * *

UNITED STATES PATENT AND TRADEMARK OFFICE
CERTIFICATE OF CORRECTION

| | | |
|---|---|---|
| PATENT NO. | : 8,699,724 B2 | Page 1 of 1 |
| APPLICATION NO. | : 13/065719 | |
| DATED | : April 15, 2014 | |
| INVENTOR(S) | : King | |

It is certified that error appears in the above-identified patent and that said Letters Patent is hereby corrected as shown below:

On the title page, in item [74] Attorney, Agent, or Firm, in column 2, line 1, delete "Neal Patel" and insert -- Neel Patel --, therefor.

In the Claims

Column 4, line 50, Claim 1, after "one" delete "a".

Column 6, line 4, Claim 8, delete "corresponding" and insert -- correspondingly --, therefor.

Signed and Sealed this
Twenty-ninth Day of July, 2014

Michelle K. Lee
*Deputy Director of the United States Patent and Trademark Office*